(12) United States Patent
Yamaga

(10) Patent No.: US 8,089,031 B2
(45) Date of Patent: Jan. 3, 2012

(54) HEATING APPARATUS FOR HEATING OBJECTS TO BE HEATED, HEATING METHOD FOR HEATING THE OBJECTS TO BE HEATED, AND STORAGE MEDIUM IN WHICH COMPUTER-READABLE PROGRAM IS STORED

(75) Inventor: Kenichi Yamaga, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 912 days.

(21) Appl. No.: 12/071,816

(22) Filed: Feb. 26, 2008

(65) Prior Publication Data

US 2008/0203084 A1 Aug. 28, 2008

(30) Foreign Application Priority Data

Feb. 27, 2007 (JP) .................................. 2007-048125
Feb. 14, 2008 (JP) .................................. 2008-033519

(51) Int. Cl.
*F27B 5/18* (2006.01)
*F27D 19/00* (2006.01)
*G01K 1/14* (2006.01)
*G01K 7/32* (2006.01)
*H01L 21/02* (2006.01)
*H01L 21/66* (2006.01)

(52) U.S. Cl. ........ 219/441; 219/411; 219/494; 219/486; 118/50.1; 118/725; 374/117; 374/120

(58) Field of Classification Search .................. None
See application file for complete search history.

(56) References Cited

U.S. PATENT DOCUMENTS 2,456,811 A * 12/1948 Blackburn ...................... 327/42

(Continued)

FOREIGN PATENT DOCUMENTS

JP 10-25577 1/1998

(Continued)

OTHER PUBLICATIONS

Honal et al, "Langasite Surface Acoustic Wave Sensors for High Temperatures," 2000, 2000 IEEE/EIA International Frequency Control Symposium, pp. 113-117.*

(Continued)

*Primary Examiner* — Joseph M Pelham
(74) *Attorney, Agent, or Firm* — Smith, Gambrell & Russell, LLP

(57) ABSTRACT

The present invention provides a heating apparatus for heating objects to be processed, which can detect a temperature of the objects to be processed with higher precision and accuracy, thereby to achieve higher precision temperature control. A heating apparatus 2 includes a processing vessel 8 configured to contain therein a plurality of objects W to be processed, the objects W including objects 58a to 58e to be processed for temperature measurement, each object 58a to 58e having each corresponding elastic wave element 60a to 60e, a heating means 10 adapted for heating the objects W to be processed, and a holding means 22 adapted to hold the objects W to be processed. To the processing vessel 8, a transmitter antenna 52 adapted to transmit an electric wave for measurement toward each elastic wave element 60a to 60e, and a receiver antenna 52 adapted to receive an electric wave having a frequency corresponding to the temperature and generated from each elastic wave element 60a to 60e are provided. A temperature analyzer 66 adapted to obtain the temperature of the wafers W to be processed for temperature measurement is connected with the receiver antenna 52, and a temperature control unit 64 adapted to control the heating means 10 is in turn connected with the temperature analyzer 66.

29 Claims, 9 Drawing Sheets

U.S. PATENT DOCUMENTS

| | | | |
|---|---|---|---|
| 3,519,924 A * | 7/1970 | Burton | 324/71.1 |
| 4,472,656 A * | 9/1984 | Franx | 310/361 |
| 5,371,365 A * | 12/1994 | Watanabe et al. | 850/1 |
| 5,730,528 A * | 3/1998 | Allison et al. | 374/161 |
| 5,825,121 A * | 10/1998 | Shimada | 310/358 |
| 6,149,968 A * | 11/2000 | Shimada | 427/100 |
| 6,387,225 B1 * | 5/2002 | Shimada et al. | 204/192.18 |
| 7,896,544 B2 * | 3/2011 | Nagashima et al. | 374/176 |
| 2002/0030723 A1 * | 3/2002 | Sumi et al. | 347/68 |
| 2004/0183868 A1 * | 9/2004 | Sumi et al. | 347/71 |
| 2006/0203877 A1 * | 9/2006 | Heyman et al. | 374/117 |
| 2007/0051176 A1 * | 3/2007 | Liu | 73/579 |
| 2007/0170170 A1 * | 7/2007 | Sata et al. | 219/497 |

FOREIGN PATENT DOCUMENTS

| | | |
|---|---|---|
| JP | 2000-77346 | 3/2000 |
| JP | 2004-150860 | 5/2004 |
| JP | 2004140167 A * | 5/2004 |
| JP | 2006-303431 | 11/2006 |
| WO | 2005/010970 | 2/2005 |

OTHER PUBLICATIONS

Hornsteiner et al, "Surface Acoustic Wafe Sensors for High Temperature Applications," 1998, 1998 IEEE International Frequency Control Symposium, pp. 615-620.*

Japanese Office Action issued on Sep. 6, 2011 for Application No. 2008-033519 w/ English language translation.

* cited by examiner

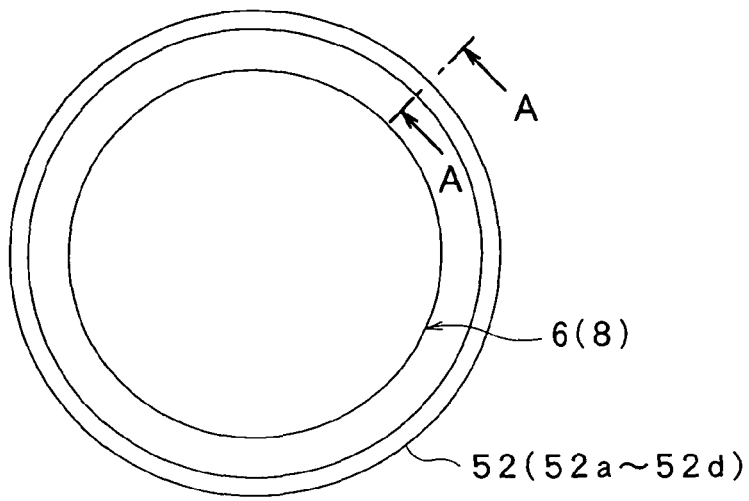 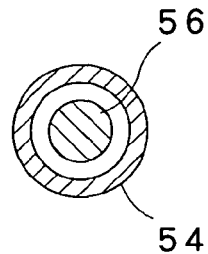
FIG. 2A　　　　　　FIG. 2B
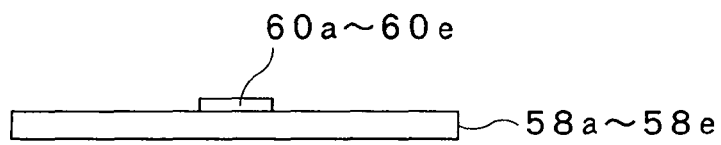
FIG. 3A
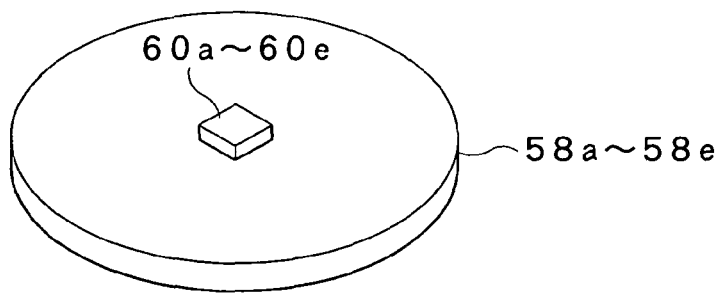
FIG. 3B
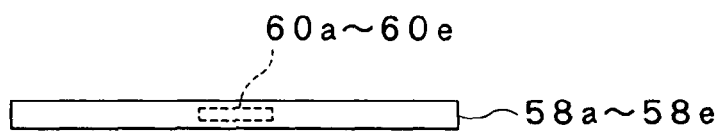
FIG. 3C

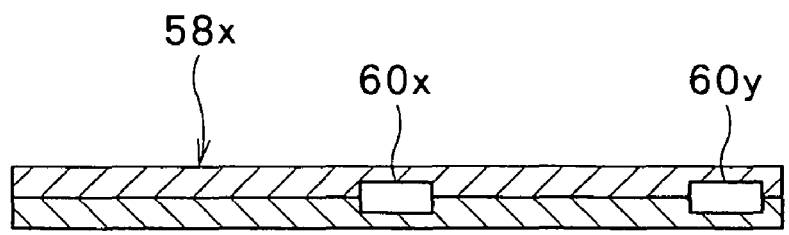
FIG. 1 1 A
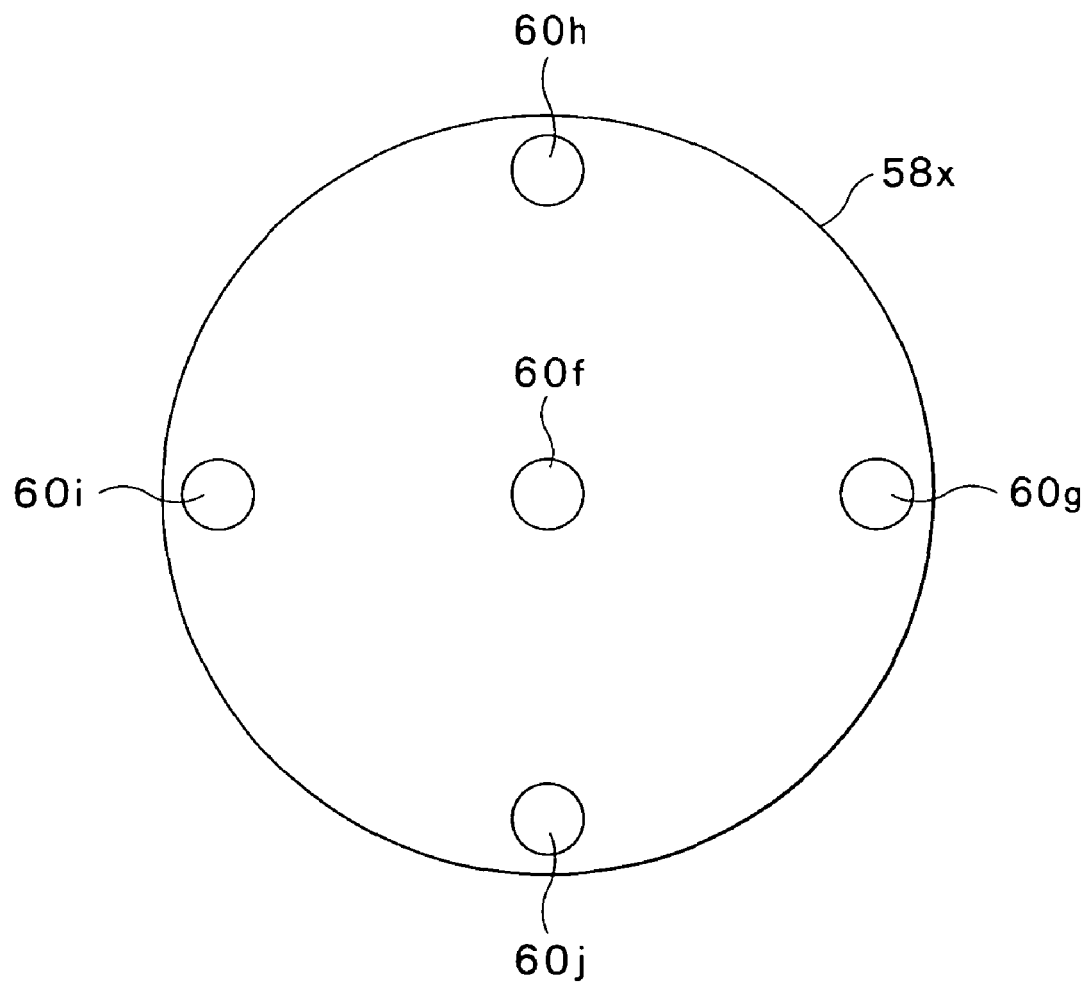
FIG. 1 1 B

HEATING APPARATUS FOR HEATING OBJECTS TO BE HEATED, HEATING METHOD FOR HEATING THE OBJECTS TO BE HEATED, AND STORAGE MEDIUM IN WHICH COMPUTER-READABLE PROGRAM IS STORED

CROSS REFERENCE TO RELATED APPLICATIONS

This application is based upon the prior Japanese Patent Application No. 2007-048125 filed on Feb. 27, 2007, and Japanese Patent Application No. 2008-033519 filed on Feb. 14, 2008, the entire contents of which are incorporated herein by reference.

BACKGROUND OF THE INVENTION

1. Field of the Invention

The present invention relates to a heating apparatus for heating objects to be heated, such as semiconductor wafers or the like, in order to provide a heating process to the objects to be processed, and also relates to a heating method for heating the object to be processed and to a storage medium in which a computer-readable program is stored.

2. Background Art

In general, upon forming semiconductor integrated circuits, such as ICs or the like, various processes, such as film-forming, etching, oxidation and diffusion, annealing and the like, are repeatedly provided to each semiconductor wafer composed of a silicon substrate or the like. Of these processes, when the heating, which is representative of the film-forming process, is provided to each semiconductor, temperature control for the wafer is one of key factors. Namely, in order to keep a film-forming speed for a thin film to be formed on the wafer surface and/or face-to-face uniformity and in-plane uniformity of the film thickness higher and/or better, the temperature of each wafer should be controlled with higher precision.

For example, as the heating apparatus, a vertical-type heating apparatus, which can provide the heating process to multiple sheets of wafers at a time, will be described by way of example. First, the semiconductor wafers supported in a multistage fashion are loaded (carried) into a vertical-type processing vessel, and then the wafers are heated by a heating means provided around an outer circumference of the heating vessel so as to elevate the wafer temperature. Thereafter, the film-forming process is provided to the wafers by stabilizing the temperature and flowing a film-forming gas in the processing vessel. In this case, a thermo-couple is provided in and/or outside the processing vessel, such that the wafers can be kept at a predetermined temperature, by controlling the electric power to be applied to the heating means, based on temperature information obtained from the thermo-couple (e.g., see Patent Documents 1 and 2).

The processing vessel has a length sufficient for containing, for example, about 50 to 150 sheets of wafers therein. Therefore, upon performing the temperature control in the processing vessel, the interior of the processing vessel is divided into a plurality of heating zones in the vertical direction in order to perform the temperature control individually for each heating zone, so as to achieve higher resolution and precision temperature control. In this case, a separate thermo-couple is provided directly to a dummy wafer for experimental use, so as to experimentally obtain in advance a mutual relation between an actual temperature of the dummy wafer to be detected by the separate thermo-couple and a temperature to be measured by the thermo-couple provided in or outside the processing vessel. Thus, upon heating the wafers as products, the temperature control will be performed while referring to the obtained mutual relation.

Patent Document 1: TOKUKAIHEI No. 10-25577, KOHO
Patent Document 2: TOKUKAI No. 2000-77346, KOHO In the temperature control method for the heating apparatus as described above, the thermo-couple is not directly contacted with the wafers as objects whose temperature is to be measured. Therefore, a correlation between the actual temperature of the wafers as the products is not always completely coincident with a value to be measured by the thermo-couple. Especially, due to attachment of undesired or unwanted deposits onto an inner wall face or the like of the processing vessel after repeated film-forming processes, and/or due to alteration of the gas flow rate and/or processing pressure, and/or due to fluctuation of electric power or the like, a difference from the mutual relation described above may tend to be increased too much, as such making it significantly difficult to appropriately control the wafer temperature.

There is also a demand for controlling the wafer temperature during raising and lowering the wafer temperature. However, if the thermo-couple as described above is employed in such a case, the difference between the actual wafer temperature and the value to be measured by the thermo-couple is further increased, thus making it quite difficult to respond to such a demand. To solve this problem, it might be envisioned that the thermo-couple is provided to the wafer itself. However, since the thermo-couple is wired, such a structure can not adapt itself to rotation and/or loading of the wafer. In addition, due to potential problems of metal contamination or the like attributable to the thermo-couple, such a structure can not be accepted.

With respect to a sheet-feeding-type processing apparatus, as disclosed in TOKUKAI No. 2004-140167, KOHO, it might also be envisioned to obtain the wafer temperature by employing a quartz resonator adapted to receive electromagnetic waves corresponding to the temperature. However, the heat resistance of the quartz is approximately 300° C. at the most, as such it can not be used for the heating apparatus to be operated under the temperature condition higher than 300° C.

SUMMARY OF THE INVENTION

The present invention was made in view of the above problems, and therefore it is an object of this invention to provide a heating apparatus for heating objects to be heated, a heating method for heating the objects to be heated and a storage medium in which a computer-readable program is stored, each of which is configured and/or intended to obtain a temperature, based on an electric wave transmitted from an elastic wave element composed of, for example, a langasite substrate element or LTGA (Lanthanum Tantalic acid Gallium Aluminum), so that the temperature of the objects to be processed can be precisely and accurately detected, in a wireless and real-time fashion, without causing metal contamination or the like, thereby providing higher precision temperature control.

From studies that we have made about the temperature measurement for the semiconductor wafers, it was found that the elastic wave element employing langasite or LTGA or the like will generate an elastic wave when subjected to electric stimulation. Thus, an electric wave is generated and transmitted, based on a sound wave. As such, we found that, by receiving the electric wave, the wafer temperature can be directly measured in a wireless fashion. The present invention is based on this knowledge.

The present invention is a heating apparatus for heating objects to be processed, comprising: a processing vessel, which can contain therein a plurality of objects to be processed including an object to be processed for temperature measurement, the object to be processed for temperature measurement being provided with an elastic wave element; a heating means provided around the outer circumference of the processing vessel and adapted to heat the plurality of objects to be processed; a holding means adapted to hold the plurality of objects to be processed and configured to load and unload the plurality of objects to be processed relative to the processing vessel; a transmitter antenna provided to the processing vessel and adapted to transmit an electric wave for measurement to the elastic wave element of the object to be processed for temperature measurement; a receiver antenna provided to the processing vessel and adapted to receive an electric wave generated from the elastic wave element of the object to be processed for temperature measurement and having a frequency corresponding to a temperature of the object to be processed for temperature measurement; a temperature analyzer connected with the receiver antenna and adapted to obtain the temperature of the object to be processed for temperature measurement based on the electric wave received by the receiver antenna; and a temperature control unit connected with the temperature analyzer and adapted to control the heating means based on an output of the temperature analyzer.

According to this invention, the transmitter antenna and the receiver antenna are provided to the processing vessel, so as to receive the electric wave generated from the elastic wave element composed of, for example, a langasite substrate element or LTGA or the like, thereby obtaining the temperature of the objects to be processed based on the electric wave. Thus, the temperature of the objects to be processed can be detected securely and accurately, in a wireless and real-time fashion, without causing metal contamination or the like, as such achieving higher precision temperature control. Besides, since the temperature can also be directly measured upon raising and lowering the objects to be processed, for example, the temperature rising rate and/or temperature lowering rate can be accurately controlled, as such providing more appropriate temperature rising and lowering control. Furthermore, since the temperature of the objects to be processed can be obtained in a wireless manner, a significantly exact temperature of the objects to be processed can be measured even in the case in which films are attached to the inner wall faces of the processing vessel.

In this case, for example, the transmitter antenna and the receiver antenna are respectively formed into a looped shape, so as to surround the circumference of the objects to be processed. Alternatively, for example, a plurality of heating zones are provided in the processing vessel, and the object to be processed for temperature measurement is provided in plural numbers so as to be located corresponding to each heating zone, and the transmitter antenna and the receiver antenna are also provided in plural numbers so as to be located corresponding to each zone, respectively. Alternatively, for example, the frequency bands of the elastic wave elements of the objects to be processed for temperature measurement are set to be different from one another for each heating zone.

Alternatively, for example, each of the objects to be processed for temperature measurement includes a plurality of elastic wave elements, and the frequency bands of the plurality of elastic wave elements are set to be different from one another. Alternatively, for example, the elastic wave elements are provided at least at a central portion and a peripheral portion of each object to be processed for temperature measurement. Alternatively, for example, the transmitter antenna and the receiver antenna are formed into a rod-like shape extending along a longitudinal direction of the processing vessel.

Alternatively, for example, the transmitter antenna and the receiver antenna are provided in plural numbers, with a predetermined space, along the circumferential direction of the objects to be processed. Alternatively, for example, a plurality of heating zones are provided in the processing vessel, and the object to be processed for temperature measurement is provided in plural numbers so as to be located corresponding to each heating zone, and the frequency bands of the elastic wave elements of the objects to be processed for temperature measurement are set to be different from one another for each heating zone.

Alternatively, for example, each of the objects to be processed for temperature measurement includes a plurality of elastic wave elements, and the frequency bands of the plurality of elastic wave elements are set to be different from one another. Alternatively, for example, the elastic wave elements are provided at least at a central portion and a peripheral portion of each object to be processed for temperature measurement. Alternatively, for example, the transmitter antenna and the receiver antenna are provided inside the processing vessel.

Alternatively, for example, the transmitter antenna and the receiver antenna are provided outside the processing vessel. Alternatively, for example, a loading area is provided outside the processing vessel, such that the holding means unloaded from the processing vessel can wait in the loading area, wherein an additional transmitter antenna and an additional receiver antenna respectively having the same structures as those of the transmitter antenna and the receiver antenna are provided in the loading area. Alternatively, for example, the transmitter antenna and the receiver antenna are contained in a protective tube, respectively.

Alternatively, for example, from the transmitter antenna, electric waves for measurement of the frequency bands different from one another corresponding the elastic wave elements of different frequency bands are sequentially swept and sent at predetermined intervals. Alternatively, for example, from the transmitter antenna, electric waves for measurement of the frequency bands different from one another corresponding to the elastic wave elements of different frequency bands are simultaneously sent.

Alternatively, for example, the transmitter antenna and the receiver antenna are integrated as a transmitter-receiver antenna. Alternatively, for example, a thermo-couple is provided to the processing vessel and/or heating means, and the temperature control unit controls the heating means, also referring to a measured value obtained from the thermo-couple. Alternatively, for example, the processing vessel has a plasma generating means for generating a plasma by a high-frequency power for assisting a heat process of the objects to be processed, and the frequency bands of the electric waves for measurement are set to be different from the frequency band of the high-frequency power. Alternatively, for example, the elastic wave element is formed of a surface acoustic wave element. Alternatively, for example, the elastic wave element is formed of a bulk acoustic wave element. Alternatively, for example, the elastic wave element is composed of a substrate element of a material selected from the group consisting of lanthanum tantalic acid gallium aluminium (LGTA), quartz ($SiO_2$), zinc oxide (ZnO), Rochelle salt (potassium sodium tartrate: $KNaC_4H_4O_6$), titanic acid lead zirconate (PZT: Pb(Zr, Ti)$O_3$), lithium niobate ($LiNbO_3$), lithium tantalate ($LiTaO_3$), litium tetraborate ($Li_2B_4O_7$), langasite ($La_3Ga_5SiO_{14}$), aluminum nitride, tourmaline, and poly vinylidene fluoride (PVDF).

The present invention is a heating method for heating objects to be processed, in which method a holding means holding a plurality of objects to be processed is introduced into a processing vessel provided with a transmitter antenna and a receiver antenna, the plurality of objects to be processed including an object to be processed for temperature measurement, and the object to be processed for temperature measurement being provided with an elastic wave element, and in which method a heating process is provided to the objects to be processed, by heating them by using a heating means provided around the outer circumference of the processing vessel, the method comprising: a transmission step of transmitting an electric wave for measurement from the transceiver antenna to the elastic wave element of the object to be processed for temperature measurement; a reception step of receiving an electric wave generated from the elastic wave element of the object to be processed for temperature measurement by using a receiver antenna, the elastic wave element having received the electric wave for measurement; a temperature analysis step of obtaining a temperature of the object to be processed for temperature measurement based on the electric wave received by the receiver antenna; and a temperature control step of controlling the heating means based on the temperature obtained in the temperature analysis step.

In this case, for example, a plurality of heating zones are provided in the processing vessel, and the object to be processed for temperature measurement is provided in plural numbers, corresponding to each heating zone, and the frequency bands of the elastic wave elements of the objects to be processed for temperature measurement are set to be different from one another for each heating zone. Alternatively, for example, a thermo-couple is provided to the processing vessel and/or heating means, and in the temperature control step, the heating means is controlled, with a measured value obtained from the thermo-couple being also referred to. Alternatively, for example, spare objects to be processed for temperature measurement are prepared in advance, so that the objects to be processed for temperature measurement can be automatically replaced by the spare objects to be processed for temperature measurement, as needed or periodically. Alternatively, for example, a heat process of the object to be processed is assisted by a plasma generated by a high-frequency power, and the frequency of the electric wave for measurement is set to be different from the frequency of the high-frequency power. Alternatively, for example, the elastic wave element is formed of a surface acoustic wave element or a bulk acoustic wave element.

The present invention is a storage medium in which a computer readable program is stored, the program being used for driving a computer to perform a heating method for heating objects to be processed, in which method a holding means holding a plurality of objects to be processed is introduced into a processing vessel provided with a transmitter antenna and a receiver antenna, the plurality of objects to be processed including an object to be processed for temperature measurement, and the object to be processed for temperature measurement being provided with an elastic wave element, and in which method a heating process is provided to the objects to be processed, by heating them by using a heating means provided around the outer circumference of the processing vessel, the method comprising: a transmission step of transmitting an electric wave for measurement from the transceiver antenna to the elastic wave element of the object to be processed for temperature measurement; a reception step of receiving an electric wave generated from the elastic wave element of the object to be processed for temperature measurement by using a receiver antenna, the elastic wave element having received the electric wave for measurement; a temperature analysis step of obtaining a temperature of the object to be processed for temperature measurement based on the electric wave received by the receiver antenna; and a temperature control step of controlling the heating means based on the temperature obtained in the temperature analysis step.

According to this invention, the following prominent effects can be obtained. Namely, the transmitter antenna and the receiver antenna are provided to the processing vessel, so as to receive the electric wave generated from the elastic wave element composed of, for example, a langasite substrate element or LTGA or the like, thereby obtaining the temperature of the objects to be processed based on the electric wave. Thus, the temperature of the objects to be processed can be detected securely and accurately, in a wireless and real-time manner, without causing metal contamination or the like, as such providing higher precision temperature control. In addition, because the temperature can also be directly measured upon raising and lowering the objects to be processed, for example, the temperature rising rate and/or temperature lowering rate can be accurately controlled, as such providing more appropriate temperature rising and lowering control. Furthermore, since the temperature of the objects to be processed can be obtained in a wireless manner, a significantly exact temperature of the objects to be processed can be measured even in the case in which films or the like are attached to the inner wall faces of the processing vessel.

BRIEF DESCRIPTION OF THE DRAWINGS

FIG. 2A is a plan view showing a positional relationship between a processing vessel and a looped transmitter-receiver antenna, and FIG. 2B is a cross section taken along line A-A of FIG. 2A.

FIG. 3A is a side view of an object to be processed for temperature measurement, to which an elastic wave element is provided, FIG. 3B is a perspective view of the objected to be processed for temperature measurement, to which the elastic wave element is provided, and FIG. 3C is a perspective view of the object to be processed for temperature measurement in which the elastic wave element is embedded.

FIG. 11A is a cross section showing a modification 1 of the wafer for use in temperature measurement, and FIG. 11B is a plan view showing a modification 2 of the wafer for use in temperature measurement.

DETAILED DESCRIPTION OF THE INVENTION

EXAMPLES

Figure 1:
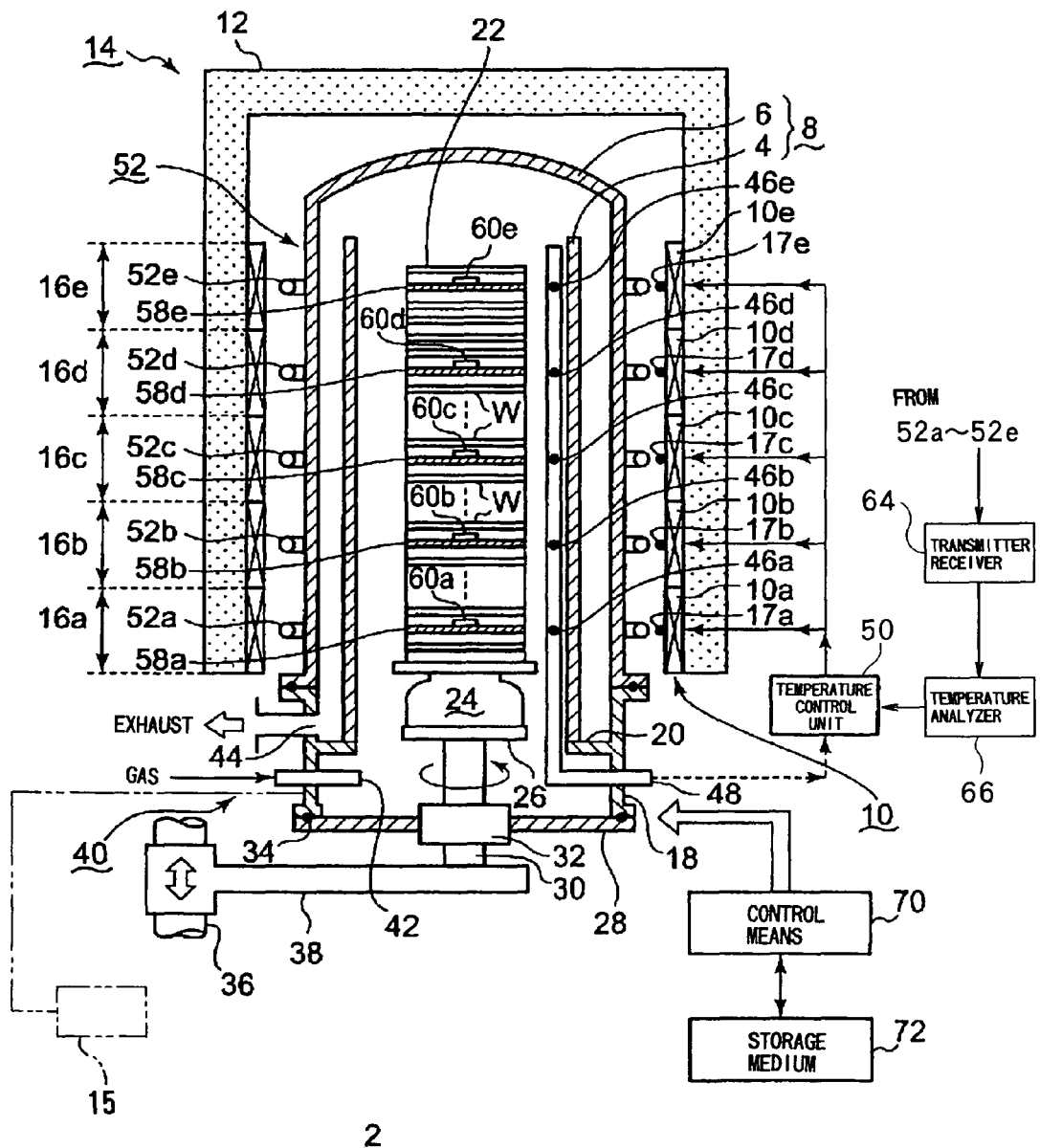
FIG. 1 is a cross-sectional schematic view showing a heating apparatus according to the present invention.
Figure 4:
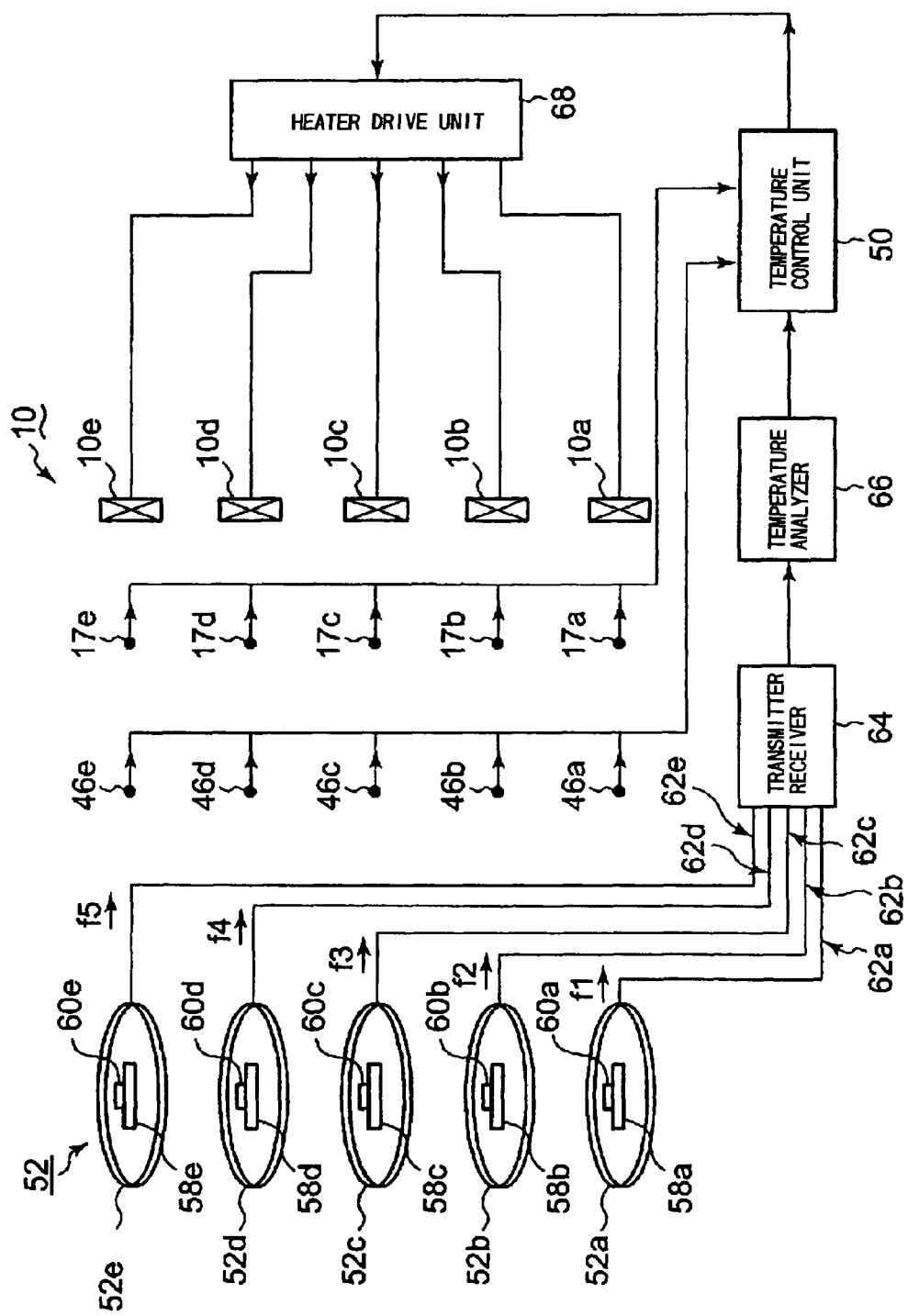
FIG. 4 is a schematic diagram showing a temperature control system of the heating apparatus.
Figure 5:
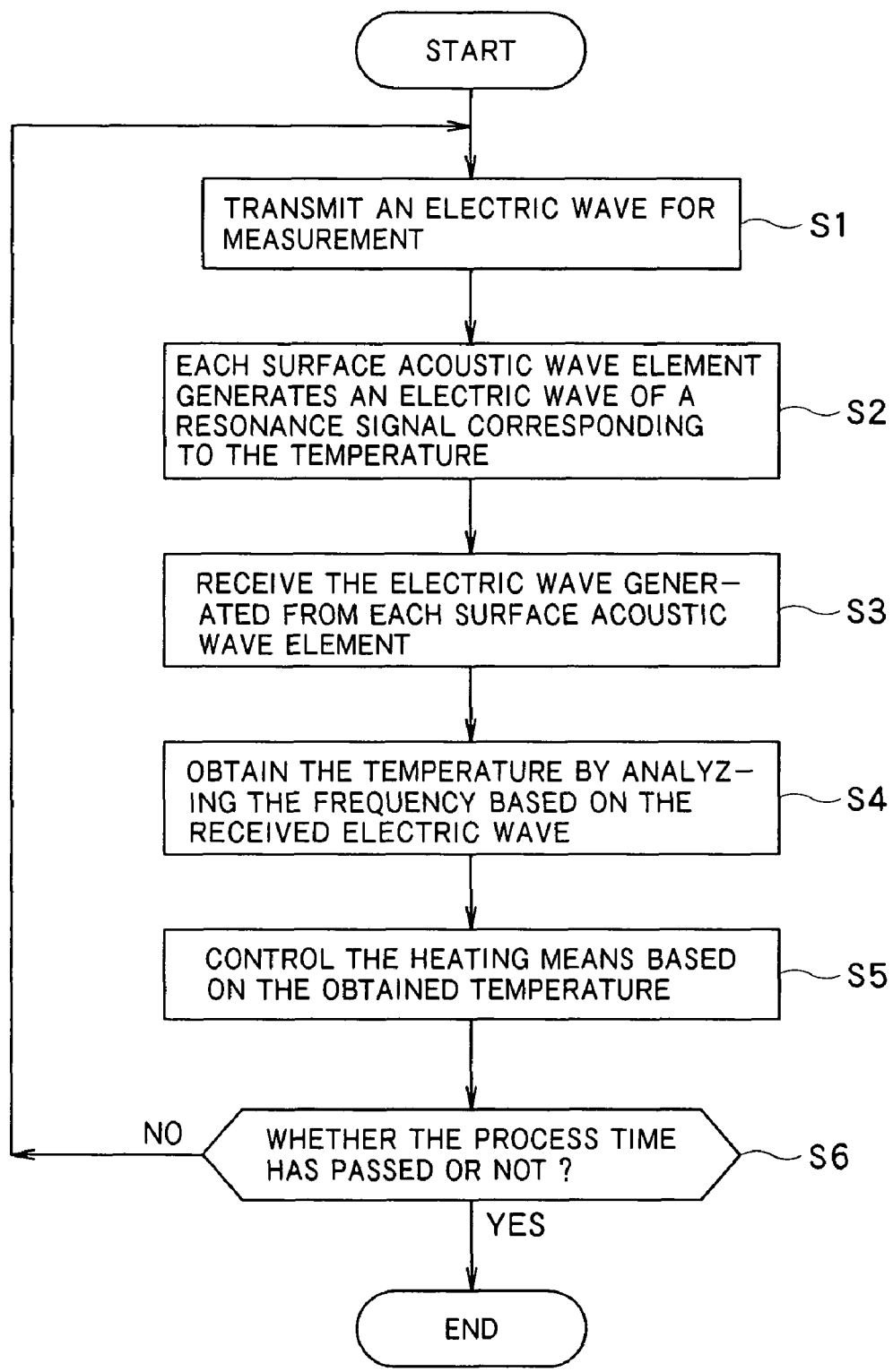
FIG. 5 is a flow-chart showing one example of a heating method of the present invention.
Figure 6A:
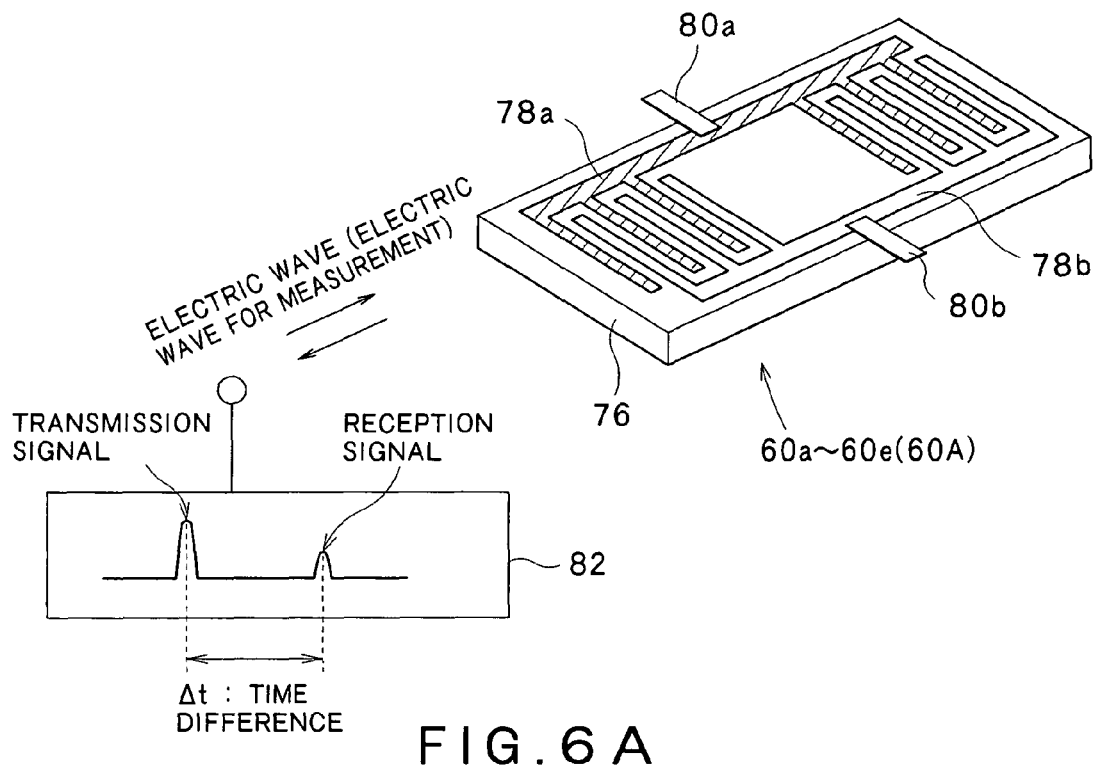
FIG. 6A is a diagram showing a principle of operation for explaining the principle of operation of the elastic wave element formed of a surface acoustic wave element.
Figure 6B:
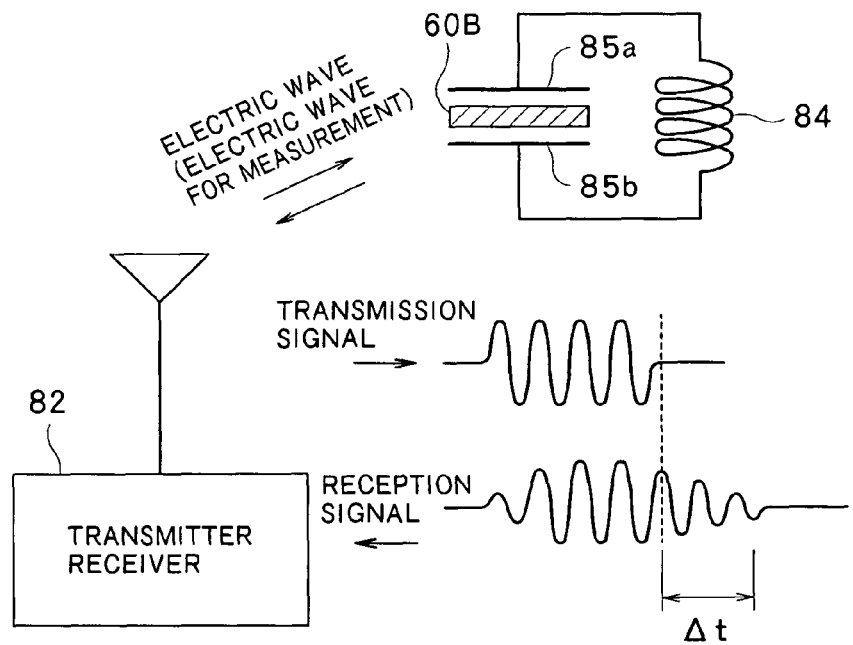
FIG. 6B is a diagram showing a principle of operation for explaining the principle of operation of the elastic wave element formed of a bulk acoustic wave element.

Hereinafter, one embodiment of the present invention will be detailed with reference to the accompanying drawings. FIG. 1 is a cross-sectional schematic view showing a heating apparatus according to the present invention. FIGS. 2A and 2B are diagrams respectively provided for illustrating a positional relationship between a processing vessel and a looped transmitter-receiver antenna, FIGS. 3A, 3B, and 3C are diagrams respectively provided for illustrating an objected to be processed for temperature measurement, to which an elastic wave element is provided, FIG. 4 is a schematic diagram showing a temperature control system of the heating apparatus, FIG. 5 is a flow-chart showing one example of a heating method of the present invention, and FIGS. 6A and 6B are diagrams showing a principle of operation for explaining the principle of operation of the elastic wave element.

In the description below, a case in which a transmitter-receiver antenna formed by combining a transmitter antenna and a receiver antenna and used as both of the antennae will be discussed by way of example. Herein, a vertical-type heating apparatus will be described by way of example.

As shown in FIG. 1, a heating apparatus 2 includes a processing vessel 8 having a double-wall structure. The heating vessel 8 is composed of a cylindrical inner tube 4 formed from quartz, and a cylindrical outer tube 6 having a ceiling, formed from quartz, and arranged outside and concentrically with the inner tube 4. Around the outer circumference of the heating vessel 8, a heating furnace 14 is located. The heating furnace 14 includes a heating means 10 composed of a heater or the like, and a heat insulating material 12. The heating means 10 is configured to heat a plurality of objects (or semiconductor wafers W) to be processed, which will be described below. The heating means 10 is provided over the whole inner side face of the heat insulating member 12. A heating region of the processing vessel 8 is divided into multiple, for example, herein, five, heating zones 16a, 16b, 16c, 16d, 16e, each arranged in the vertical direction for temperature control. The heating means 10 is composed of five heaters 10a, 10b, 10c, 10d, 10e, each of which may or may not correspond to each heating zone 16a to 16e. These five heaters can be controlled individually. It should be noted that the number of the zones is not limited in particular to this aspect. To the heaters 10a to 10e, heater thermocouples 17a to 17e adapted for measuring temperatures of these heaters are provided, respectively.

A bottom end of the processing vessel 8 is supported by a cylindrical manifold 18 formed from, for example, stainless steel. A bottom end of the inner tube 4 is supported on a support ring 20 attached to an inner wall of the manifold 18. It is noted that the manifold 18 may be formed from quartz or the like so that it can be molded integrally with the processing vessel 8. Below the manifold 18, a wafer boat (or holding means) 22 formed from quartz will be located, with multiple sheets of semiconductor wafers W (or objects to be processed) being loaded thereon. The wafer boat (or holding means) 22 is configured to be optionally raised and lowered in order to load and unload the semiconductor wafers W (or objects to be processed) relative to the processing vessel 8. While a typical size of the semiconductor wafers W is, for example, 300 mm, in diameter, but it is not limited in particular to this size.

The wafer boat 22 is placed on a rotary table 26 via a heat insulating mould 24 formed from quartz. The rotary table 26 is supported on a rotation shaft 30 extending through a cover 28 adapted for opening and closing a bottom end opening of the manifold 18. To a portion through which the rotation shaft 30 extends, a seal 32 formed from, for example, a magnetic fluid, is provided, such that the magnetic fluid seal 32 can airtightly seal and rotatably support the rotation shaft 30. Between the periphery of the cover 28 and the bottom end of the manifold 18, a seal member 34 composed of, for example, an O-ring or the like, is provided, so as to keep sealing ability for the processing vessel 8.

The rotation shaft 30 described above is attached to a distal end of an arm 38 supported by a lifting mechanism 36, such as a boat elevator or the like, such that the wafer boat 22, cover 28 and the like can be raised and lowered together.

To a side portion of the manifold 18, a gas introducing means 40 is provided. Specifically, the gas introducing means 40 includes gas nozzles 42 extending through the manifold 18, such that each necessary gas can be supplied into the processing vessel 8, with the flow rate of the gas being controlled. It should be appreciated that although only one of the gas nozzles 42 is exemplarily depicted in the drawing, they are, in fact, provided in plural numbers, corresponding to kinds of gases to be used. As the gas nozzles 42, the so-called distribution nozzle extending upward in the processing vessel 8 and having a plurality of gas injection holes may also be used. In a side wall of the manifold 18, an exhaust port 44 is provided for discharging the atmosphere in the processing vessel 8 from a space between the inner tube 4 and the outer tube 6. To the exhaust port 44, a vacuum exhaust system (not shown) including, for example, a vacuum pump and/or pressure control valve provided between the exhaust port 44 and the vacuum exhaust system, is connected.

Between the inner tube 4 and the wafer boat 22, five internal thermo-couples 46a to 46e are provided, corresponding to the respective heaters 10a to 10e. Each internal thermo-couple 46a to 46e is contained in a single protective tube 48 formed from quartz. A bottom end of the protective tube 48 is bent so as to airtightly extend through the side portion of the manifold 18. A detection value obtained by each of the thermo-couples 17a to 17d and 46a to 46e is inputted to a temperature control unit 50 composed of, for example, a microcomputer or the like. The detection value is used as supplementary data upon individually controlling the electric power to be supplied to each heater 10a to 10e during the heating process, as will be described below.

In addition, a transmitter-receiver antenna 52 as one of features of the present invention is provided to the processing vessel 8. As described above, the transmitter-receiver antenna 52 is formed by combining a transmitter antenna and a receiver antenna and serves as both of the antennae. However, the antenna 52 is not limited to this aspect, but it may be provided in a state in which the transmitter antenna and the receiver antenna are separated from each other.

Specifically, the transmitter-receiver antenna 52, as shown in FIG. 2A, is formed into a loop-like shape, such that it is positioned outside the processing vessel 8 so as to surround it. In this case, the transmitter-receiver antenna 52 is composed of five transmitter-receiver antennae 52a, 52b, 52c, 52d, 52e, corresponding to wafers 58a to 58e each used for temperature measurement as will be described below. Namely, each transmitter-receiver antenna 52a to 52e is provided to surround the circumference of each corresponding wafer W. Each transmitter-receiver antenna 52a to 52e, as shown in FIG. 2B, is formed by inserting an antenna cable 56 composed of a conductor into a protective tube 54. The protective tube 54 is composed of a ceramic material formed from, for example, quartz, alumina or the like, which material being transparent to electric waves and having adequate heat resistance and corrosion resistance. As the antenna cable 56, platinum or the like can be used.

As shown in FIG. 1, besides the semiconductor wafers W as products, a dummy wafer and/or wafer for temperature measurement, as an object to be processed for temperature measurement, provided with an elastic wave element, which is one of features of this invention, is held on the wafer boat 22. As the elastic wave element, it is possible to use any of a surface acoustic wave element and a bulk acoustic wave element. Specifically, five wafers 58a, 58b, 58c, 58d, 58e for temperature measurement are held on the wafer boat 22, corresponding to the respective heaters 10a to 10e. These five wafers 58a, 58b, 58c, 58d, 58e for temperature measurement are held at optimal positions in which the heaters 10a to 10e can be properly controlled, respectively. Namely, the wafers 58a, 58b, 58c, 58d, 58e are positioned in the vicinity of the corresponding transmitter-receiver antennae 52a to 52e, respectively, so that even a weak electric wave can readily reach each antenna.

The wafers 58a, 58b, 58c, 58d, 58e include elastic wave elements 60a, 60b, 60c, 60d, 60e (see FIGS. 3A, 3B, and 3C), respectively. Thus, electric waves are transmitted from the transmitter-receiver antennae 52a to 52e to the elastic wave elements 60a to 60e, respectively. Then, the transmitter-receiver antennae 52a to 52e receive electric waves generated from the elastic wave elements 60a to 60e, respectively.

As shown in FIGS. 3A and 3B, the elastic wave elements 60a to 60e may be disposed on the upper surface of the wafers for temperature measurement 58a to 58e. However, not limited thereto, as shown in FIG. 3C, the elastic wave elements 60a to 60e may be embedded in the wafers for temperature measurement 58a to 58e. The embedding manner is not specifically limited, and it is possible to interpose each of the elastic wave elements 60a to 60e between two very thin wafer members to be embedded therein. Alternatively, it is possible to form a hole in a surface of each of the wafers for temperature measurement 58a to 58e in which each of the elastic wave elements 60a to 60e are received and embedded.

For each elastic wave element 60a to 60e as, e.g., a surface acoustic wave element, for example, a langasite substrate element employing langasite ($La_3Ga_5SiO_{14}$) can be used. On the other hand, LTGA (lanthanum tantalic acid gallium aluminium: $La_3Ta_{0.5}Ga_{5.5-x}Al_xO_{14}$) can be used as the bulk acoustic wave element. In this case, frequency bands of the elastic wave elements 60a to 60e are preferably set to be different from one another in order to prevent mutual interference.

Now, a temperature control system employing the transmitter-receiver antennae 52a to 52e will be described, also referring to FIG. 4. As shown in FIG. 4, the transmitter-receiver antennae 52a to 52e are electrically connected with a transmitter receiver 64 via lines 62a to 62e, respectively. The transmitter-receiver antennae 52a to 52e are configured to transmit electric waves to the elastic wave elements 60a to 60e as well as to individually receive electric waves sent from the corresponding elastic wave elements 60a to 60e, respectively. The respective lines 62a to 62e may be protected by inserting them in, for example, a protective tube formed from quartz, or otherwise these lines 62a to 62e may be gathered in a single line. It is noted that when the transmitter-receiver antennae 52a to 52e are separated into transmitter antennae and receiver antennae respectively, the transmitter receiver 64 is also separated into a transmitter and a receiver.

When the respective elastic wave elements 60a to 60e are adjusted to respond to frequency bands different from one another, different electric waves for measurement different from one another corresponding to the different frequency bands are sent from the transmitter of the transmitter receiver 64. In this case, electric waves for measurement of the frequency bands different from one another may be simultaneously sent. Alternatively, electric waves for measurement of the frequency bands different from one another may be sequentially swept and sent at predetermined intervals such as 1 second.

The processing vessel 8 may have, as a processing apparatus, a plasma generating means for generating a plasma by a high-frequency power for assisting a heat process of the wafers W. In this case, the respective frequency bands of the electric waves for measurement are set to be different from the frequency of the high-frequency power such as 13.56 MHz or 400 kHz, in order to prevent generation of noises.

The transmitter receiver 64 is connected with a temperature analyzer 66, and the temperature analyzer 66 is in turn connected with the temperature control unit 50. The temperature analyzer 66 obtains a temperature of each wafer 58a to 58e for temperature measurement, i.e., a temperature of each heating zone, based on each electric wave received by each transmitter-receiver antenna 52a to 52e. Thereafter, based on an output concerning the temperature of each heating zone obtained by the temperature analyzer 66, the temperature control unit 50 controls each heater 10a to 10e, individually and independently, via a heater drive unit 68.

Each measured value of the temperature obtained by the thermo-couples 17a to 17e and 46a to 46e are also inputted to the temperature control unit 50, respectively, so as to aid temperature control due to the heating means 10 described above. It is noted that the internal thermo-couples 46a to 46e and/or heater thermo-couples 17a to 17e may be omitted.

Returning to FIG. 1, the entire operation of the heating apparatus 2 constructed as described above is controlled by a control means 70 composed of, for example, a computer or the like. The temperature control unit 50 is under the control of the control means 70, as such the control means 70 can optionally control the temperature control unit 50. A program of the computer for performing the entire operation of the heating apparatus 2 is stored in a storage medium 72, such as a floppy, a compact disc (CD), a hard disk, a flash memory and the like. Specifically, depending on a command from the control means 70, start and stop of supplying each gas, flow rate control of the gas, and control of the processing temperature and/or processing pressure are performed.

Next, a heating method performed by employing the heating apparatus constructed as described above will be discussed, also referring to FIG. 5. FIG. 5 is a flow-chart showing one example of the heating method of the present invention. Prior to performing a heating process, such as actual film-forming or the like, a mutual relation between the temperature of each wafer 58a to 58e for temperature measurement to be detected by the electric wave of the frequency generated from each elastic wave element 60a to 60e corresponding to each heating zone and the electric power to be supplied to each heater 10a to 10e is obtained in advance. The mutual relation is then stored in the temperature control unit 50. In the case of using the thermo-couples 17a to 17e and 46a to 46e as well, the mutual relation between the temperature detection value obtained therefrom and the temperature obtained from the electric wave of each elastic wave element 60a to 60e is also obtained in advance.

Next, a procedure upon providing a heating process, such as actual film-forming or the like, to the semiconductor wafers W will be described. First, when the semiconductor wafers W are in an unloaded state and kept in a waiting state in a loading area located in a lower portion of the heating apparatus 2. The processing vessel 8 is kept at a processing temperature, or otherwise at a temperature lower than the processing temperature. Thereafter, the wafer boat 22 is loaded into the processing vessel 8 by raising it from below, with the multiple sheets of wafers W of an ordinary temperature being loaded in the wafer boat 22. Consequently, the cover 28 will close the bottom end opening of the manifold 18, as such hermetically sealing the processing vessel 8. In the wafer boat 22, besides the wafers W as the products, the wafers 58a to 58e or temperature measurement are held in positions respectively corresponding to the heating zones 16a to 16e.

Then, the internal space of the processing vessel 8 is maintained at a processing pressure, while the wafer temperatures are detected by the thermo-couples 17a to 17e and 46a to 46e, respectively. In addition, the wafer temperatures are detected from the electric waves to be generated from the elastic wave elements 60a to 60e, respectively. With operation of the temperature control system shown in FIG. 4, the electric power applied to the respective heaters 10a to 10e is increased so as to elevate the wafer temperature, as such the processing temperature can be stabilized and maintained at a predetermined value. Thereafter, processing gases for desired film-forming will be introduced into the processing vessel 8 from the gas nozzles 42 of the gas introducing means 40, respectively.

After the processing gases are introduced into a bottom portion of the inner tube 4 through the gas nozzles 42, respectively, they rise while contacting with the wafers W rotating therein, providing a film-forming reaction to the wafers W. Thereafter, the processing gases flow downward from the ceiling through a gap provided between the inner tube 4 and the outer tube 6, and are then discharged outside the vessel from the exhaust port 44. The temperature control of the wafers W during the process can be performed by controlling the electric power supplied to each heater 10a to 10e under, for example, the PID control. In this case, the wafer temperature of each heating zone is first obtained from the electric wave generated from each elastic wave element 60a to 60e, and the obtained wafer temperature is then controlled to be a predetermined target temperature.

Also referring to FIGS. 6A and 6B, a principle of operation of the elastic wave elements 60a to 60e will be described. FIG. 6A is a diagram showing a principle of operation for explaining the principle of operation of the elastic wave element formed of a surface acoustic wave element, and FIG. 6B is a diagram showing a principle of operation for explaining the principle of operation of the elastic wave element formed of a bulk acoustic wave element. As shown in FIG. 6A, each surface acoustic wave element 60A is composed of a langasite substrate element as disclosed in, for example, TOKUKAI No. 2000-114920, KOHO, TOKUKAI No. 2003-298383, KOHO or TOKUKAI No. 2004-140167, KOHO, etc. The langasite substrate element includes a langasite substrate 76 of a quadrilateral shape having a piezoelectric function. The size of this langasite substrate 76 is, for example, approximately 10 mm×15 mm×0.5 mm. On a surface of the langasite substrate 76, a pair of comb-like electrodes 78a, 78b are formed, and antennae 80a, 80b are attached to the electrodes 78a, 78b, respectively.

When a high-frequency voltage is applied to the comb-like electrodes 78a, 78b, respectively, by transmitting thereto a high-frequency electric wave corresponding to the natural frequency of the langasite substrate 76 as a transmission signal from the transmitter and receiver 64, a surface acoustic wave is generated by excitation due to a piezoelectric effect of the langasite substrate 76. In this case, the acoustic velocity is changed depending on the temperature of the langasite substrate 76, and the surface acoustic wave in turn resonates depending on the acoustic velocity. Thus, a resultant resonance signal will be outputted as an electric wave from the antennae 80a, 80e.

Accordingly, by analyzing a time difference Δt between a reception signal to be obtained by receiving the outputted electric wave described above by using the transmitter receiver 64 and the aforementioned transmission signal, the temperature of the langasite substrate 76 can be detected. Namely, each element can be used as a wireless temperature detection element. Such a principle is applied to each elastic wave element 60a to 60e.

As shown in FIG. 6B, a bulk acoustic wave element 60B represented by LTGA is also manufactured by interposing the bulk acoustic wave element 60B between a pair of electrodes 85a and 85b connected to a coil 84.

Also in this case, by transmitting a predetermined high-frequency electric wave corresponding to the natural frequency of the bulk acoustic wave element 60B from a transmitter receiver 82, a signal outputted from the bulk acoustic wave element 60B is received. By analyzing Δt between the transmittance signal and the reception signal, a temperature of the bulk acoustic wave element 60B can be detected. Such a principle is applied to each elastic wave element 60a to 60e.

The frequency band of each element can be changed by altering a pitch of each electrode 78a, 78b and a cutting out angle or a cutting out thickness from a single crystal. In this case, as described above, the elastic wave elements 60a to 60e are set at different frequency bands from one another. For instance, the element 60a is set at a frequency band f1 centered at, for example, 10 MHz, the element 60b is set at a frequency band f2 centered at, for example, 20 MHz, the element 60c is set at a frequency band f3 centered at, for example, 30 MHz, the element 60d is set at a frequency band f4 centered at, for example, 40 MHz, and the element 60e is set at a frequency band f5 centered at, for example, 50 MHz, respectively, thereby preventing interference.

As shown in FIG. 5, in actual temperature control, transmission electric power is first supplied from the transmitter receiver 64 to each transmitter-receiver antenna 52a to 52e corresponding to each heating zones 16a to 16e, and an electric wave for measurement corresponding to the natural frequency of the langasite substrate (in a case of the surface acoustic wave element) or the LTGA substrate (in a case of the bulk acoustic wave element) is then transmitted from each transmitter-receiver antenna 52a to 52e to each elastic wave element 60a to 60e of each wafer 58a to 58e for temperature measurement (S1: transmission step). Then, each elastic wave element 60a to 60e of each wafer 58a to 58e for temperature measurement, which received the electric wave for measurement from each transmitter-receiver antenna 52a to 52e, generates a resonance corresponding to the temperature of each wafer 58a to 58e for temperature measurement, and radiates a resultant resonance signal (S2). The principle of generating the electric wave in this case is as previously described with reference to FIGS. 6A and 6B.

The electric wave generated is then received by each transmitter-receiver antenna 52a to 52e corresponding to each heating zone and propagated toward the transmitter receiver 64 (S3: reception step). Consequently, the electric wave for each heating zone is analyzed by the temperature analyzer 66, so that the temperature of each wafer 58a to 58e for temperature measurement, i.e., the temperature of the wafer W of each heating zone 16a to 16e can be directly obtained (S4: temperature analysis step).

Thereafter, the temperature control unit 50 controls each heater 10a to 10e of the heating means 10 to be the target temperature, individually and independently, via the heater drive unit 68, based on the temperature obtained by the temperature analysis step (S5: temperature control step). Thus, the wafer temperature (or temperature of the wafers for temperature measurement) can be directly measured and detected, thereby providing higher precision temperature control.

Such a series of controlling operations will be repeated (No of S6) until a predetermined processing time goes by (YES of S6). In this manner, the transmitter-receiver antennae 52a to 52e are provided to the processing vessel 8 so as to receive the electric wave transmitted from each elastic wave element 60a to 60e composed of, for example, the langasite substrate element or the LTGA element and obtain the wafer temperature based on the received electric wave. Thus, the temperature of the objects to be processed (or semiconductor wafers) W, i.e., each wafer 58a to 58e for temperature measurement, can be detected precisely and accurately, in a wireless and real-time fashion, without causing metal contamination or the like, thereby providing higher precision temperature control.

Because the wafer temperature can be directly measured also in the case of raising and lowering the objects W to be processed, for example, the temperature rising rate and/or temperature lowering rate can be accurately controlled, thus providing more appropriate temperature rising and lowering control. Furthermore, since the temperature of the objects W to be processed can be obtained in a wireless manner, a significantly exact temperature of the objects W to be processed can be measured even in the case in which films are attached to the inner wall faces of the processing vessel 8.

In the actual temperature control, in order to perform higher precision temperature control, it is preferred to perform the temperature control also referring to the measured values respectively obtained from the heater thermo-couples 17a to 17e and/or internal thermocouples 46a to 46e, in addition to the temperature obtained from the temperature analyzer 66.

If the aforementioned electric wave for temperature measurement and the electric wave transmitted from each elastic wave element 60a to 60e are strong enough, the number of the transmitter-receiver antennae 52 may be reduced to one fewer than five (5). Generally, in such a case, the electric wave for temperature measurement can be strengthened to some extent, while the electric wave transmitted from each elastic wave element 60a to 60e is remained weak. Accordingly, the transmitter-receiver antennae 52 fewer than five in number may be provided, while the receiver antennae may be additionally provided to other heating zones than those to which the transmitter-receiver antennae 52 are provided.

Furthermore, if the electric wave transmitted from each elastic wave element 60a to 60e can reach the antenna of the corresponding heating zone, but is too weak to reach the antennae of the adjacent heating zones, there is no risk of interference. Accordingly, there is no need for setting the frequency band of each elastic wave element 60a to 60e to be different from one another. As such, all of the elastic wave elements may be set at the same frequency band. In addition, if the thermo-couples 17a to 17e and/or internal thermo-couples 46a to 46e are provided in the apparatus, the temperature of the processing vessel 8 can be elevated in advance to an appropriate temperature even upon idling time the wafers W are unloaded and the processing vessel 8 is vacant.

Figure 7:
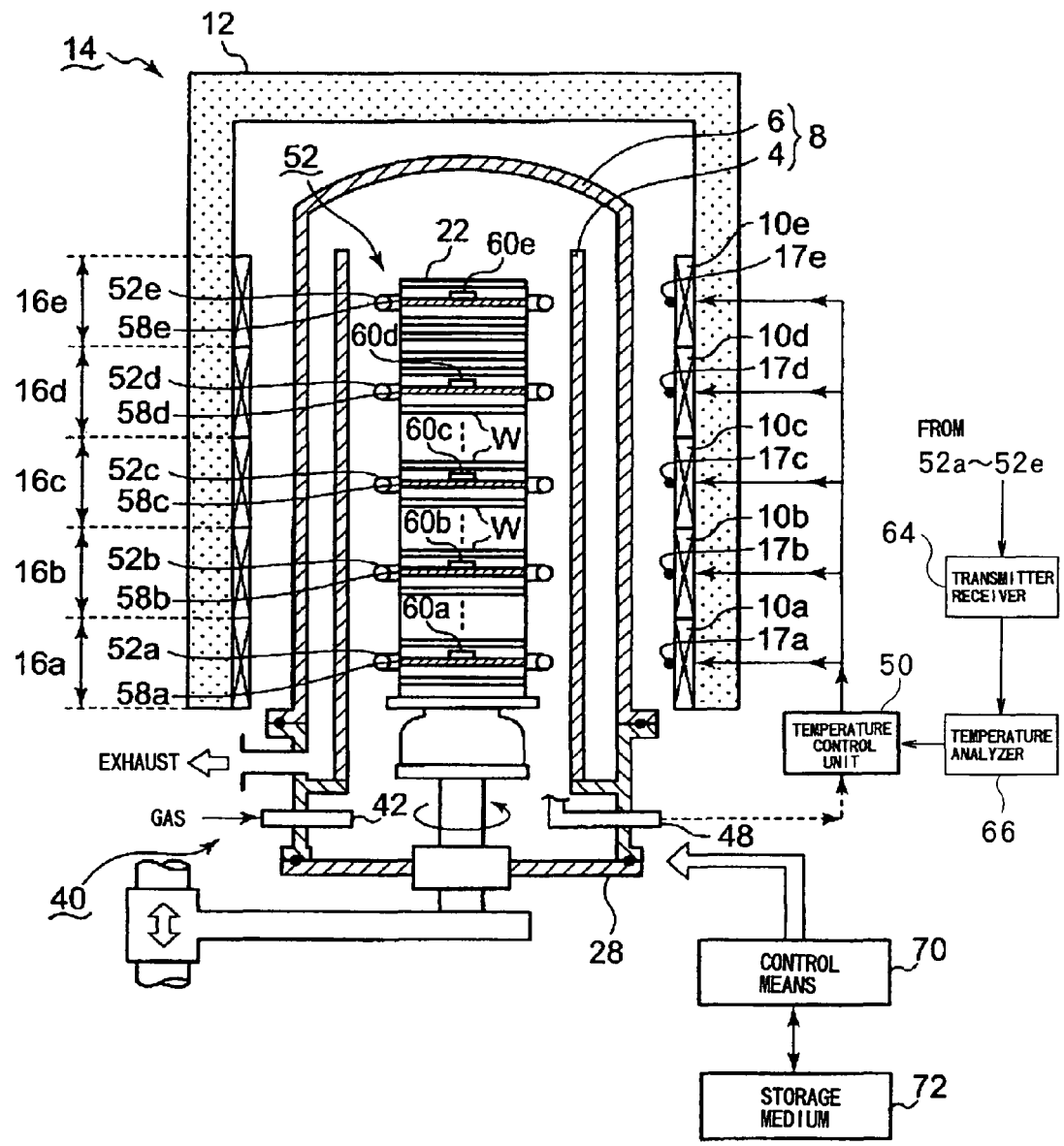
FIG. 7 is a diagram showing a first modification of the heating apparatus of the present invention.

While, in the embodiment described above, the transmitter-receiver antennae 52a to 52e are provided outside the processing vessel 8, the arrangement of these antennae is not limited to this aspect. For instance, the transmitter-receiver antennae 52a to 52e may be provided inside the processing vessel 8 as described in a first modification of the heating apparatus of the present invention shown in FIG. 7. In this case, the transmitter-receiver antennae 52a to 52e are provided between the inner tube 4 of the processing vessel 8 and the wafer boat 22, respectively. In FIG. 7, like reference numerals are assigned to like components which are the same as those shown in FIG. 1.

Figures 8, 9:
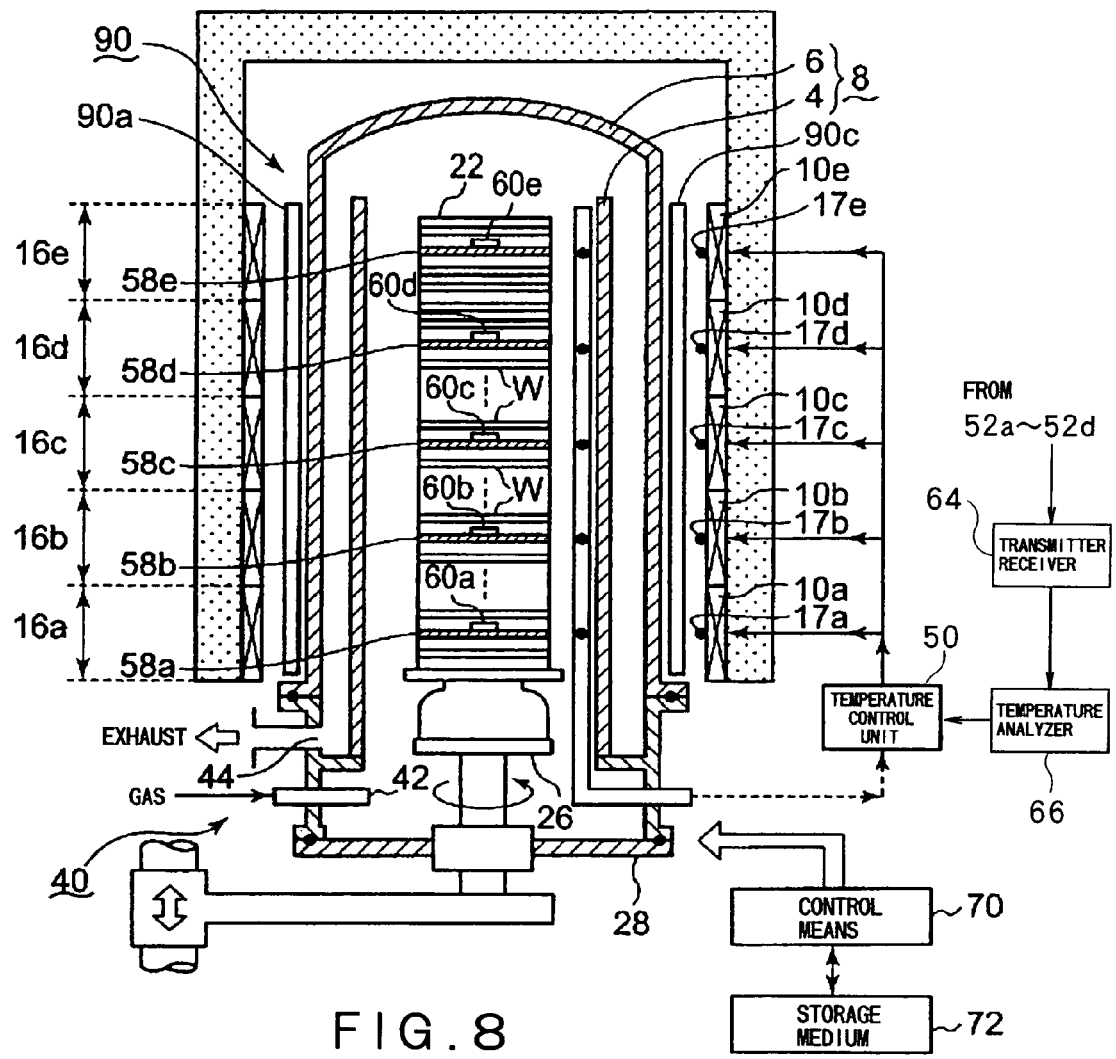
FIG. 8 is a diagram showing a second modification of the heating apparatus of the present invention.
FIG. 9 is a plan view showing one example of arrangement of rod-like antennae in the heating apparatus shown in FIG. 8.

Furthermore, while the looped antennae are employed as the transmitter-receiver antennae 52a to 52e in the embodiments respectively shown in FIGS. 1 and 7, the antennae are not limited to this aspect. For instance, rod-like transmitter-receiver antennae (including rod-like transmitter antennae and rod-like receiver antennae) may also be used. FIG. 8 shows a second modification of the heating apparatus of the present invention of this type, and FIG. 9 is a plan view showing one example of arrangement of the rod-like antennae of the heating apparatus shown in FIG. 8. It is noted that like reference numerals are assigned to like parts which are the same as those shown in FIG. 1.

In FIG. 8, a transmitter-receiver antenna 90 is provided outside the processing vessel 8, the antenna 90 being formed into a rod-like shape extending along the longitudinal direction of the processing vessel 8. In FIG. 9, the antenna 90 is composed of a plurality of, for example, four, rod-like transmitter-receiver antennae 90a, 90b, 90c, 90d arranged with an equal space along the outer circumference of the processing vessel. It should be appreciated that the number of the antennae may be one, as well as may be increased or decreased depending on the strength of the electric wave. Alternatively, the rod-like transmitter-receiver antennae 90a to 90d may be located inside the processing vessel 8.

In the case of using such rod-like transmitter-receiver antennae 90a to 90d, each of the transmitter-receiver antennae 90a to 90d can receive the electric waves transmitted from all of the elastic wave elements 60a to 60e of the corresponding heating zones 16a to 16e. Accordingly, in order to prevent the interference, the frequency bands of the respective elastic wave elements 60a to 60e are set to be different from one another. Also in this case, the same effect as one obtained from the heating apparatus shown in FIG. 1 can be obtained.

Figure 10:
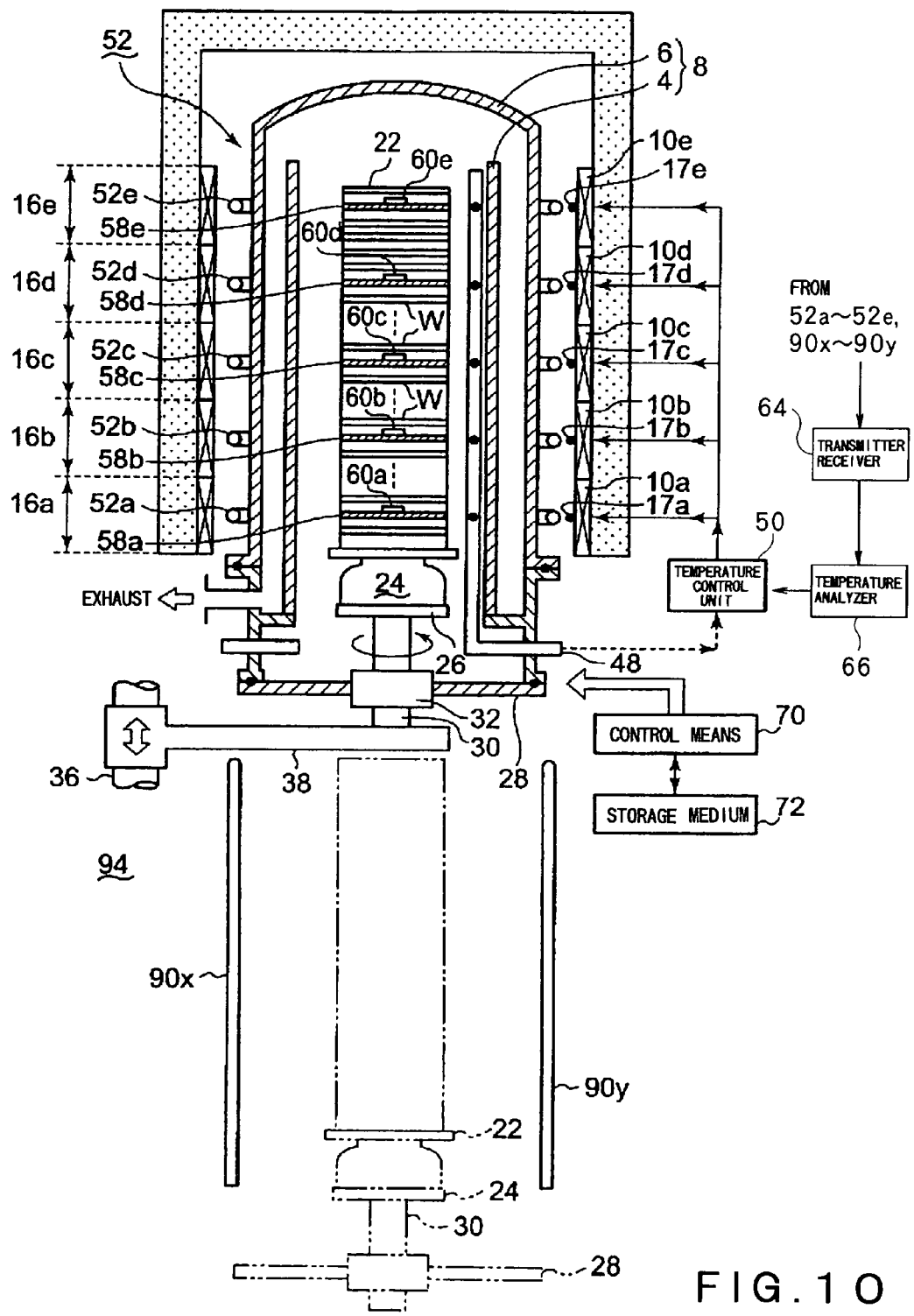
FIG. 10 is a diagram showing a third modification of the heating apparatus of the present invention.

While, in each embodiment described above, a case in which the transmitter-receiver antennae 52a to 52d or 90a to 90d are provided only to the processing vessel 8 has been discussed, the arrangement is not limited to this aspect. Namely, as described in a third modification of the heating apparatus of this invention, as shown in FIG. 10, a loading area 94, in which the wafer boat 22 unloaded from the processing vessel 8 waits so as to load the wafers W therein, is provided below the processing vessel 8. To the loading area 94, additional transmitter-receiver antennae 90x, 90y (or additional transmitter antennae and additional receiver antennae) may be provided. As described above, in this loading area 94, the loading operation of wafers W is performed, and in some cases, the wafer boat 22 itself is also moved in the horizontal direction. Thus, it is preferred that the transmitter-receiver antennae 90x, 90y are provided in a rod-like shape, rather than in a looped shape, and that these transmitter-receiver antennae 90x, 90y are arranged along a route in which the wafer boat 22 is moved in the horizontal direction.

With this configuration, the temperature of the wafers held by the wafer boat 22 can be obtained in a real-time fashion even after the heating process. Therefore, for example, it can be exactly recognized that the wafer temperature has been lowered to an extent able to be handled. Thus, the loading of wafers W can be started without taking unduly longer waiting time, as such enhancing the throughput. In addition, the elastic wave elements are disposed on the surfaces of the wafers 58a to 58e for temperature measurement in the respective embodiments. However, not limited thereto, the elastic wave elements may be embedded in the wafers 58a to 58e for temperature measurement.

While, in each embodiment described above, a case in which a single elastic wave element 60a to 60e is provided for each wafer 58a to 58e for temperature measurement has been discussed, the arrangement is not limited to this aspect. For instance, a plurality of elastic wave elements may be provided to a single wafer for temperature measurement. FIG. 11A is a cross section showing a modification 1 of the wafer for use in temperature measurement, and FIG. 11B is a plan view showing a modification 2 of the wafer for use in temperature. measurement. In FIG. 11A, the wafer 58x for temperature measurement is divided in two parts, and two elastic wave elements 60x, 60y are embedded in the wafer, one being located at a central portion and the other being located at a peripheral portion. The divided two wafer parts are finally joined together.

In this manner, each of the two elastic wave elements 60x, 60y assumes an embedded state in the wafer 58x for temperature measurement, thus preventing occurrence of contamination attributable to these elastic wave elements 60x, 60y.

In this way, in the case in which the two elastic wave elements 60x, 60y are embedded in the single wafer 58x for temperature measurement, the frequency bands of the respective elastic wave elements 60x, 60y should be set different from each other in order to prevent interference.

In the case of the a modification 2 of the wafer for use in temperature shown in FIG. 11B, a plurality of, specifically, five elastic wave elements 60f, 60g, 60h, 60i, and 60j are disposed on a center part and a peripheral part of a surface of a wafer 58x for use in temperature measurement. These elastic wave elements 60f, 60g, 60h, 60i, and 60j may be embedded in the wafer 58x for use in temperature measurement. In this case, a distribution of an in-plane temperature of the wafer can be measured. In this case, it is preferable that frequency bands of the respective elastic wave elements 60f, 60g, 60h, 60i, and 60j are set to be different from each other in order to prevent interference.

Generally, in some film-forming processes, it is preferred that a proper temperature gradient is provided in the wafer surface upon the heating process or upon raising or lowering the wafer. In such a case, if the elastic wave elements 60x, 60y are respectively provided at the central portion and the periphery of the wafer 58x for temperature measurement as described above, a proper and accurate temperature gradient can be created in the wafer surface.

It is also contemplated that spare objects to be processed for temperature measurement each having the similar construction as that of each wafer 58a to 58e, 58x for temperature measurement as described above may be prepared in advance. In this way, the wafers 58a to 58e, 58x for temperature measurement, when degraded, may be automatically replaced by the spare objects to be processed for temperature measurement, as needed or periodically.

While, in each embodiment, the double-wall type processing vessel 8 including the inner tube 4 and the outer tube 6 has been discussed by way of example, the configuration is not limited to this aspect. For instance, this invention can also be applied to a single-wall type processing vessel. Furthermore, the processing vessel 8 is not limited to the vertical-type processing vessel, and this invention is also applicable to the horizontal-type processing vessel.

Additionally, while the film-forming process has been described herein as the heating process, it is not limited to this aspect. For instance, this invention can also be applied to oxidation and diffusion, annealing, etching, reforming and/or a process utilizing plasma. When using a plasma, as described above, it is preferable to differ the frequency of the high-frequency power for generating a plasma from the respective frequency bands of the electric waves for measurement, in order to prevent generation of noises.

For the elastic wave element, a substrate element of a material selected from the group consisting of lanthanum tantalic acid gallium aluminium (LGTA), quartz ($SiO_2$), zinc oxide (ZnO), Rochelle salt (potassium sodium tartrate: $KNaC_4H_4O_6$), titanic acid lead zirconate (PZT: $Pb(Zr, Ti)O_3$), lithium niobate ($LiNbO_3$), lithium tantalate ($LiTaO_3$), litium tetraborate ($Li_2B_4O_7$), langasite ($La_3Ga_5SiO_{14}$), aluminum nitride, tourmaline, and poly vinylidene fluoride (PVDF) can also be used. While the semiconductor wafer has been described herein by way of example as the object to be processed, it is not limited to this aspect. This invention is also applicable to glass substrates, LCD substrates, ceramic substrates and the like.

The invention claimed is:

1. A heating apparatus for heating objects to be processed, comprising:

a processing vessel, which can contain therein a plurality of objects to be processed in a vertical direction including an object to be processed for temperature measurement, the object to be processed for temperature measurement being provided with an acoustic wave element;

a heating means provided around the outer circumference of the processing vessel and adapted to heat the plurality of objects to be processed;

a holding means adapted to hold the plurality of objects to be processed in the vertical direction and configured to load and unload the plurality of objects to be processed relative to the processing vessel;

a transmitter antenna provided to the processing vessel and adapted to transmit an electric wave for measurement to the acoustic wave element of the object to be processed for temperature measurement;

a receiver antenna provided to the processing vessel and adapted to receive an electric wave generated from the acoustic wave element of the object to be processed for temperature measurement and having a frequency corresponding to a temperature of the object to be processed for temperature measurement;

a temperature analyzer connected with the receiver antenna and adapted to obtain the temperature of the object to be processed for temperature measurement based on the electric wave received by the receiver antenna; and a temperature control unit connected with the temperature analyzer and adapted to control the heating means based on an output of the temperature analyzer, wherein the acoustic wave element is composed of a substrate element of a material selected from the group consisting of lanthanum tantalic acid gallium aluminium (LGTA), zinc oxide (ZnO), Rochelle salt (potassium sodium tartrate: $KNaC_4H_4O_6$), titanic acid lead zirconate (PZT: $Pb(Zr, Ti)O_3$), lithium niobate ($LiNbO_3$), lithium tantalate ($LiTaO_3$), lithium tetraborate (Li$_2$B$_4$O$_7$), langasite (La$_3$Ga$_5$SiO$_{14}$), aluminum nitride, tourmaline, and poly vinylidene fluoride (PVDF).

2. The heating apparatus for heating the objects to be processed according to claim 1, wherein the transmitter antenna and the receiver antenna are respectively formed into a looped shape so as to surround the circumference of the objects to be processed.

3. The heating apparatus for heating the objects to be processed according to claim 2, wherein a plurality of heating zones are provided in the processing vessel, wherein the object to be processed for temperature measurement is provided in plural numbers so as to be located corresponding to each heating zone, and wherein the transmitter antenna and the receiver antenna are also provided in plural numbers so as to be located corresponding to each zone, respectively.

4. The heating apparatus for heating the objects to be processed according to claim 3, wherein the frequency bands of the acoustic wave elements of the objects to be processed for temperature measurement are set to be different from one another for each heating zone.

5. The heating apparatus for heating the objects to be processed according to claim 1, wherein each of the objects to be processed for temperature measurement includes a plurality of acoustic wave elements, and the frequency bands of the plurality of acoustic wave elements are set to be different from one another.

6. The heating apparatus for heating the objects to be processed according to claim 5, wherein the acoustic wave elements are provided at least at a central portion and a peripheral portion of each object to be processed for temperature measurement.

7. The heating apparatus for heating the objects to be processed according to claim 1, wherein the transmitter antenna and the receiver antenna are formed into a rod-like shape extending along a longitudinal direction of the processing vessel.

8. The heating apparatus for heating the objects to be processed according to claim 7, wherein the transmitter antenna and the receiver antenna are provided in plural numbers, with a predetermined spacing therebetween, along the circumferential direction of the objects to be processed.

9. The heating apparatus for heating the objects to be processed according to claim 7, wherein a plurality of heating zones are provided in the processing vessel, wherein the object to be processed for temperature measurement is provided in plural numbers so as to be located corresponding to each heating zone, and wherein the frequency bands of the acoustic wave elements of the objects to be processed for temperature measurement are set to be different from one another for each heating zone.

10. The heating apparatus for heating the objects to be processed according to claim 7, wherein each of the objects to be processed for temperature measurement includes a plurality of acoustic wave elements, and the frequency bands of the plurality of acoustic wave elements are set to be different from one another.

11. The heating apparatus for heating the objects to be processed according to claim 10, wherein the acoustic wave elements are provided at least at a central portion and a peripheral portion of each object to be processed for temperature measurement.

12. The heating apparatus for heating the objects to be processed according to claim 1, wherein the transmitter antenna and the receiver antenna are provided inside the processing vessel.

13. The heating apparatus for heating the objects to be processed according to claim 1, wherein the transmitter antenna and the receiver antenna are provided outside the processing vessel.

14. The heating apparatus for heating the objects to be processed according to claim 1,
wherein a loading area is provided outside the processing vessel, such that the holding means unloaded from the processing vessel can wait in the loading area, and
wherein an additional transmitter antenna and an additional receiver antenna respectively having the same structures as those of the transmitter antenna and the receiver antenna are provided in the loading area.

15. The heating apparatus for heating the objects to be processed according to claim 1, wherein the transmitter antenna and the receiver antenna are contained in a protective tube, respectively.

16. The heating apparatus for heating the objects to be processed according to claim 4, wherein, from the transmitter antenna, the electric waves for measurement of frequency bands different from one another corresponding to the acoustic wave elements of different frequency bands are sequentially swept and sent at predetermined intervals.

17. The heating apparatus for heating the objects to be processed according to claim 4, wherein, from the transmitter antenna, the electric waves for measurement of frequency bands different from one another corresponding to the acoustic wave elements of different frequency bands are simultaneously sent.

18. The heating apparatus for heating the objects to be processed according to claim 1, wherein the transmitter antenna and the receiver antenna are integrated as a transmitter-receiver antenna.

19. The heating apparatus for heating the objects to be processed according to claim 1,
wherein a thermo-couple is provided to the processing vessel and/or heating means, and
wherein the temperature control unit controls the heating means, also referring to a measured value obtained from the thermo-couple.

20. The heating apparatus for heating the objects to be processed according to claim 1, wherein the processing vessel has a plasma generating means for generating a plasma by a high frequency power for assisting a heat process of the objects to be processed, and the frequency bands of the electric waves for measurement are set to be different from the frequency band of the high frequency power.

21. The heating apparatus for heating the objects to be processed according to claim 1, wherein the acoustic wave element is formed of a surface acoustic wave element.

22. The heating apparatus for heating the objects to be processed according to claim 1, wherein the acoustic wave element is formed of a bulk acoustic wave element.

23. A heating method for heating objects to be processed, in which method a holding means holding a plurality of objects to be processed in a vertical direction is introduced into a processing vessel provided with a transmitter antenna and a receiver antenna, the plurality of objects to be processed including an object to be processed for temperature measurement, and the object to be processed for temperature measurement being provided with an acoustic wave element, and in which method a heating process is provided to the objects to be processed, by heating them by using a heating means provided around the outer circumference of the processing vessel, the method comprising:

a transmission step of transmitting an electric wave for measurement from the transceiver antenna to the acoustic wave element of the object to be processed for temperature measurement;

a reception step of receiving an electric wave generated from the acoustic wave element of the object to be processed for temperature measurement by using a receiver antenna, the acoustic wave element having received the electric wave for measurement;

a temperature analysis step of obtaining a temperature of the object to be processed for temperature measurement based on the electric wave received by the receiver antenna; and a temperature control step of controlling the heating means based on the temperature obtained in the temperature analysis step, wherein the acoustic wave element is composed of a substrate element of a material selected from the group consisting of lanthanum tantalic acid gallium aluminium (LGTA), zinc oxide (ZnO), Rochelle salt (potassium sodium tartrate: $KNaC_4H_4O_6$), titanic acid lead zirconate (PZT: $Pb(Zr, Ti)O_3$), lithium niobate ($LiNbO_3$), lithium tantalate ($LiTaO_3$), lithium tetraborate ($Li_2B_4O_7$), langasite ($La_3Ga_5SiO_{14}$), aluminum nitride, tourmaline, and poly vinylidene fluoride (PVDF).

24. The heating method for heating the objects to be processed according to claim 23, wherein a plurality of heating zones are provided in the processing vessel, wherein the object to be processed for temperature measurement is provided in plural numbers, corresponding to each heating zone, and wherein the frequency bands of the acoustic wave elements of the objects to be processed for temperature measurement are set to be different from one another for each heating zone.

25. The heating method for heating the objects to be processed according to claim 23,
wherein a thermo-couple is provided to the processing vessel and/or heating means, and
wherein in the temperature control step, the heating means is controlled, with a measured value obtained from the thermo-couple being also referred to.

26. The heating method for heating the objects to be processed according to claim 23, wherein spare objects to be processed for temperature measurement are prepared in advance, so that the objects to be processed for temperature measurement can be automatically replaced by the spare objects to be processed for temperature measurement, as needed or periodically.

27. The heating method for heating the objects to be processed according to claim 23, wherein a heat process of the object to be processed is assisted by a plasma generated by a high frequency power, and the frequency of the electric wave for measurement is set to be different from the frequency of the high frequency power.

28. The heating method for heating the objects to be processed according to claim 23, wherein the acoustic wave element is formed of a surface acoustic wave element or a bulk acoustic wave element.

29. A storage medium in which a computer readable program is stored, the program being used for driving a computer to perform a heating method for heating objects to be processed, in which method a holding means holding a plurality of objects to be processed in a vertical direction is introduced into a processing vessel provided with a transmitter antenna and a receiver antenna, the plurality of objects to be processed including an object to be processed for temperature measurement, and the object to be processed for temperature measurement being provided with an acoustic wave element, and in which method a heating process is provided to the objects to be processed, by heating them by using a heating means provided around the outer circumference of the processing vessel, the method comprising:

a transmission step of transmitting an electric wave for measurement from the transceiver antenna to the acoustic wave element of the object to be processed for temperature measurement;

a reception step of receiving an electric wave generated from the acoustic wave element of the object to be processed for temperature measurement by using a receiver antenna, the acoustic wave element having received the electric wave for measurement;

a temperature analysis step of obtaining a temperature of the object to be processed for temperature measurement based on the electric wave received by the receiver antenna; and a temperature control step of controlling the heating means based on the temperature obtained in the temperature analysis step, wherein the acoustic wave element is composed of a substrate element of a material selected from the group consisting of lanthanum tantalic acid gallium aluminium (LGTA), zinc oxide (ZnO), Rochelle salt (potassium sodium tartrate: $KNaC_4H_4O_6$), titanic acid lead zirconate (PZT: $Pb(Zr, Ti)O_3$), lithium niobate ($LiNbO_3$), lithium tantalate ($LiTaO_3$), lithium tetraborate ($Li_2B_4O_7$), langasite ($La_3Ga_5SiO_{14}$), aluminum nitride, tourmaline, and poly vinylidene fluoride (PVDF).

\* \* \* \* \*